United States Patent [19]

Hyde et al.

[11] Patent Number: 5,670,825
[45] Date of Patent: Sep. 23, 1997

[54] INTEGRATED CIRCUIT PACKAGE WITH INTERNALLY READABLE PERMANENT IDENTIFICATION OF DEVICE CHARACTERISTICS

[75] Inventors: John W. Hyde; Abby M. Schwartz, both of Portland, Oreg.; David A. Brown, San Jose, Calif.

[73] Assignee: Intel Corporation, Santa Clara, Calif.

[21] Appl. No.: 580,750

[22] Filed: Dec. 29, 1995

Related U.S. Application Data

[63] Continuation-in-part of Ser. No. 536,353, Sep. 29, 1995.

[51] Int. Cl.$^6$ .................. H01L 23/12; H01L 23/58
[52] U.S. Cl. ............ 257/730; 257/48; 257/773; 361/820; 324/765
[58] Field of Search ............ 257/48, 778, 797, 257/665, 730, 773; 361/820; 324/765

[56] References Cited

U.S. PATENT DOCUMENTS

| | | | |
|---|---|---|---|
| 5,107,523 | 4/1992 | Heaney et al. | 377/2 |
| 5,274,337 | 12/1993 | Young et al. | 328/138 |
| 5,334,857 | 8/1994 | Mennitt et al. | 257/48 |
| 5,351,001 | 9/1994 | Kornrumpf et al. | 324/158.1 |
| 5,410,163 | 4/1995 | Murakami | 257/48 |

FOREIGN PATENT DOCUMENTS

| | | | |
|---|---|---|---|
| 0291429 | 11/1988 | Japan | 257/665 |
| 0185744 | 8/1991 | Japan | 257/665 |
| 0369253 | 12/1992 | Japan | 257/48 |
| 0005667 | 1/1994 | Japan | 257/797 |

Primary Examiner—Tom Thomas
Assistant Examiner—David Ostrowski
Attorney, Agent, or Firm—Blakely, Sokoloff, Taylor & Zafman

[57] ABSTRACT

An integrated circuit (IC) device package that includes permanent identification regarding the device characteristics, wherein the permanent identification are at or below the surface of the package and may indicate the operating frequency of an IC die within the package, as well as voltage requirements, etc.

20 Claims, 4 Drawing Sheets

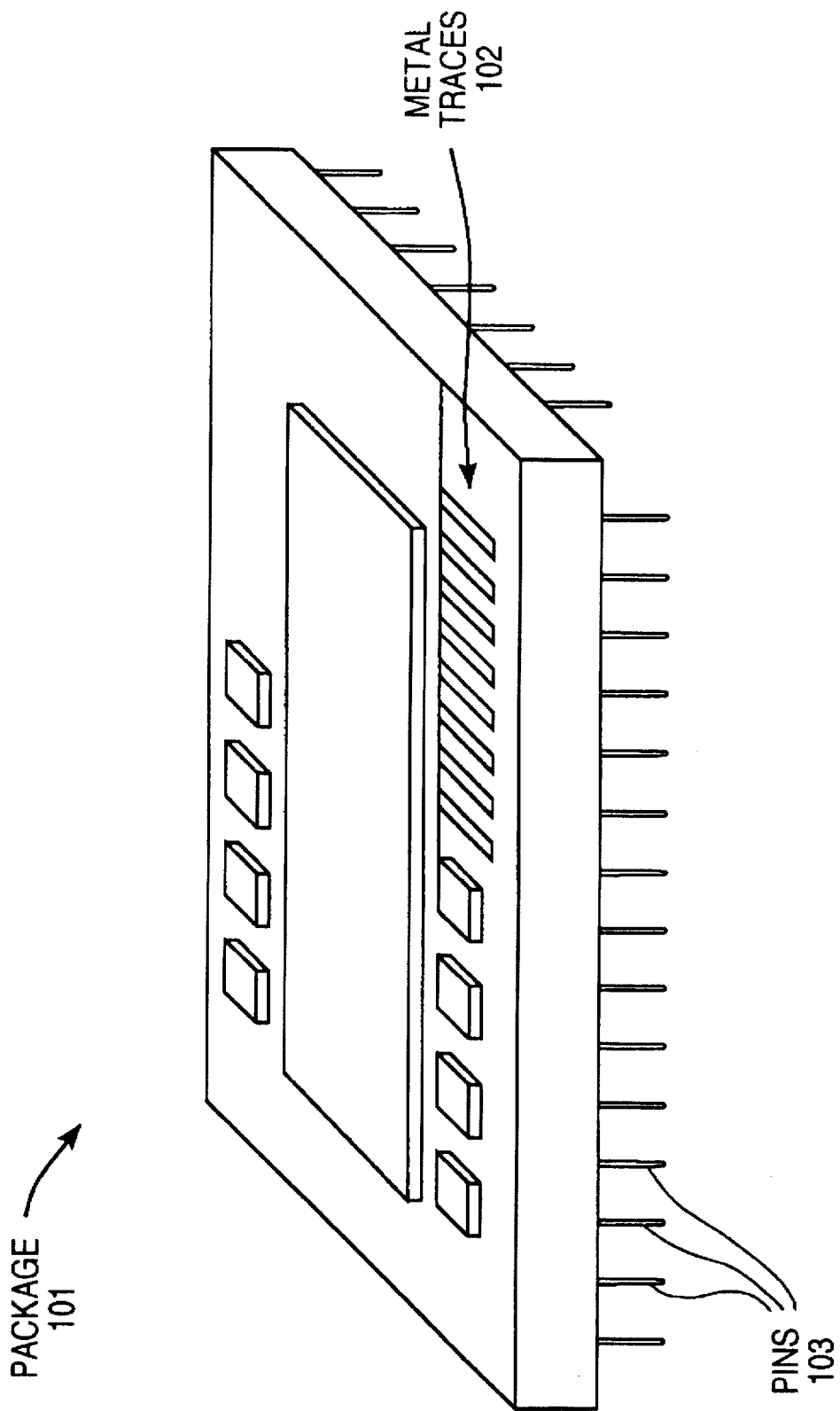
FIG_1

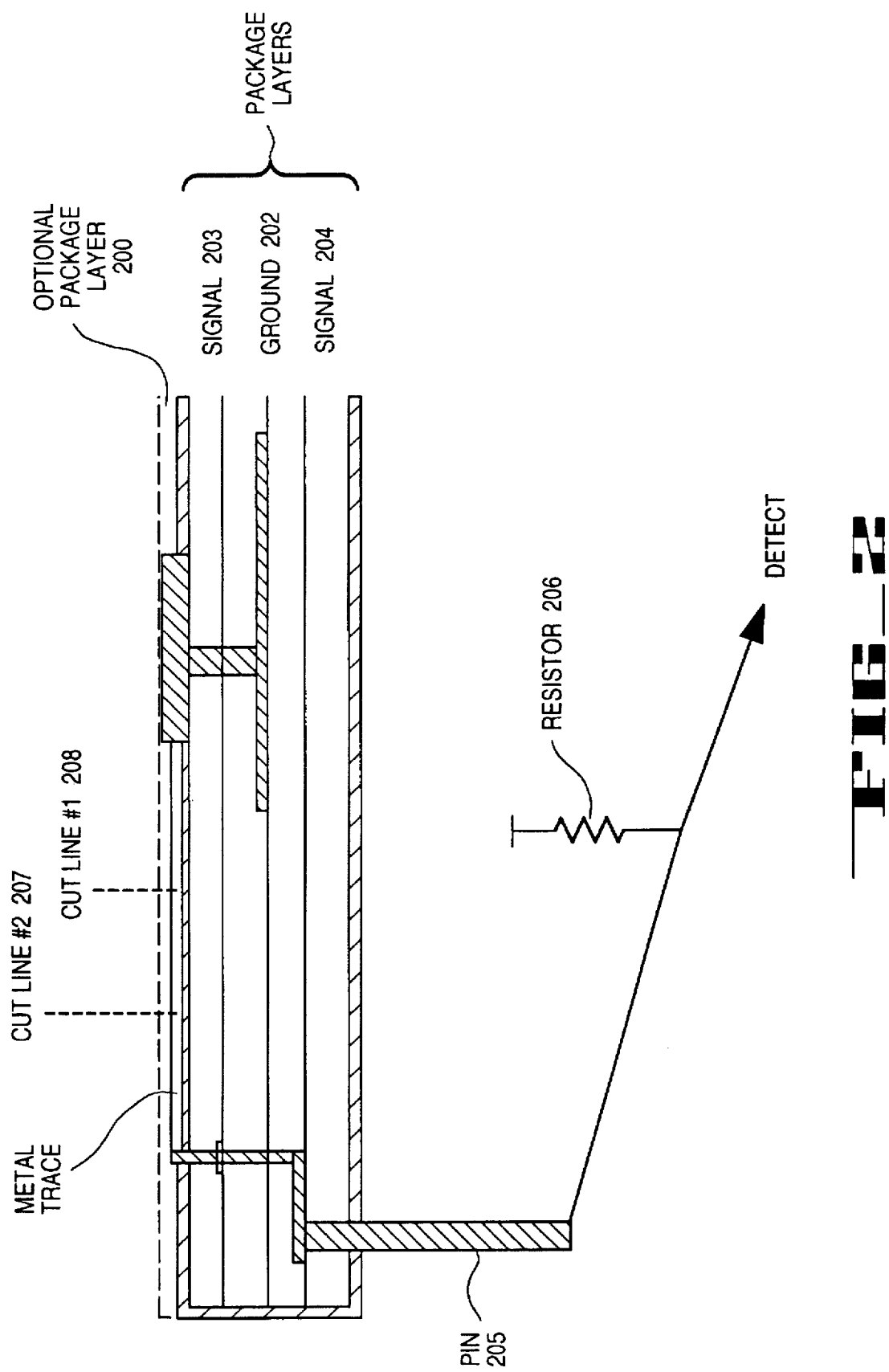
FIG._2

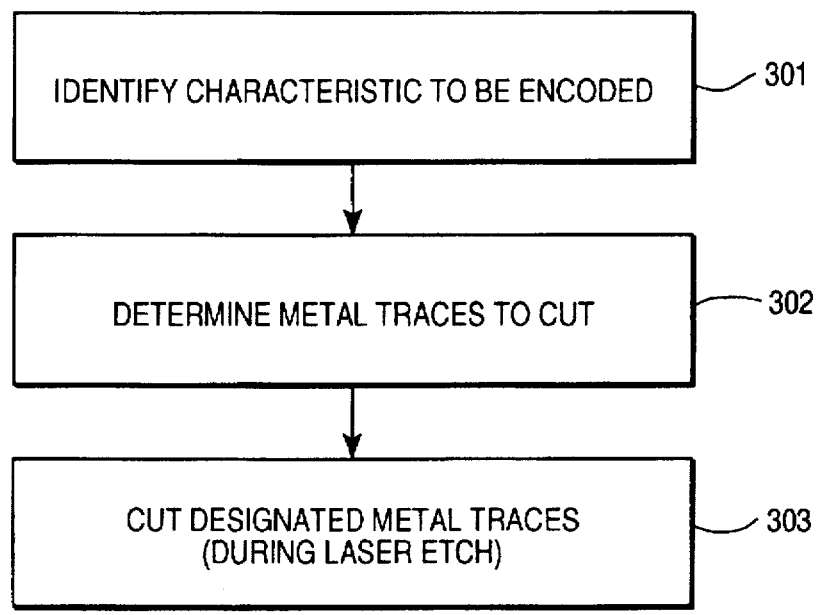
FIG_3
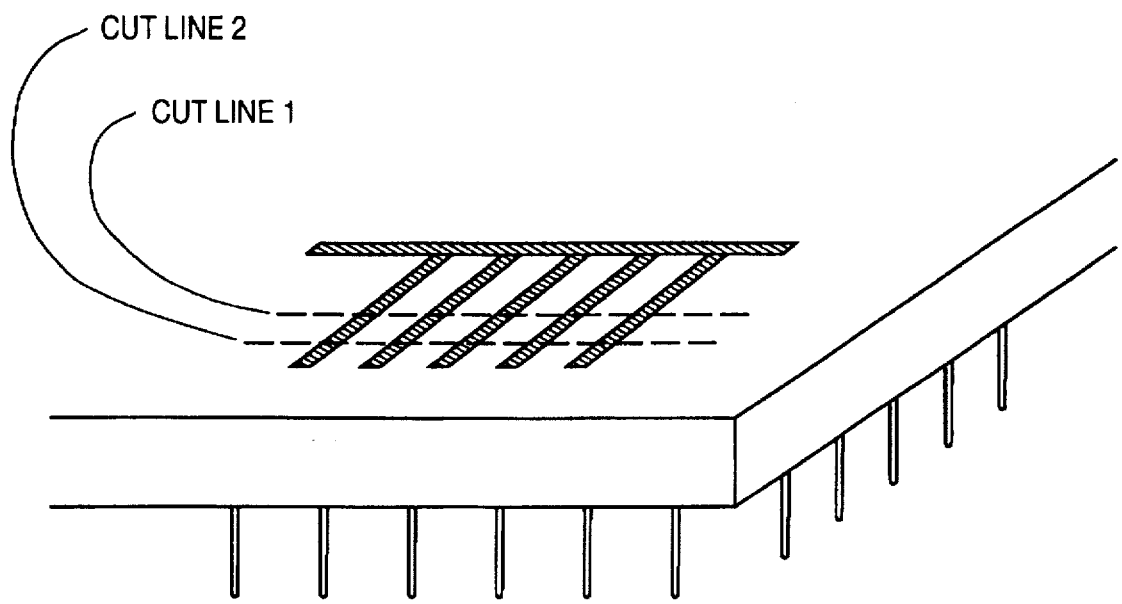
FIG_4

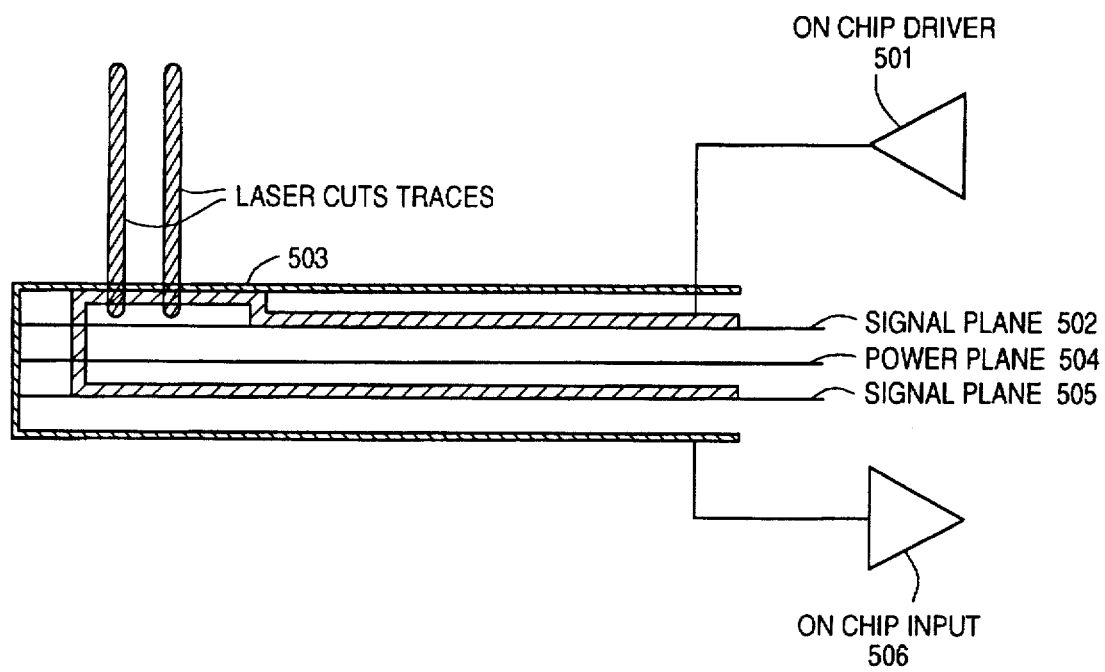
FIG_5
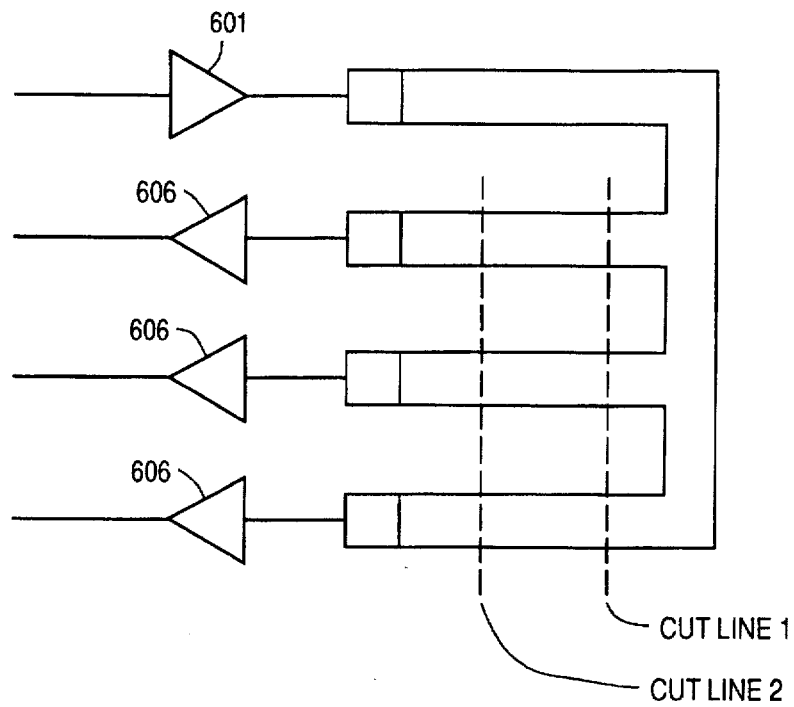
FIG_6

INTEGRATED CIRCUIT PACKAGE WITH INTERNALLY READABLE PERMANENT IDENTIFICATION OF DEVICE CHARACTERISTICS

This application is a continuation-in-part of Ser. No. 08/536,353, entitled Integrated Circuit Package With Permanent Identification of Device Characteristics and Method for Adding the Same, filed Sep. 29, 1995.

FIELD OF THE INVENTION

The present invention relates to the field of integrated circuit (IC) devices; more particularly, this invention relates to IC packages that have permanent identification of device characteristics contained therein.

BACKGROUND OF THE INVENTION

Processors and other integrated circuits in systems function according to an operating frequency. Many such systems include multiple devices. These devices do not always have the same operating frequency. For instance, some of today's computer systems include a processor that operates at one frequency while devices and the bus to which they are coupled operate at another frequency. In these systems, the bus typically operates at some fraction of the core speed of the processor. Thus, there is a bus/core speed ratio associated with the system. When devices have different operating frequencies, an interface is required to allow them to communicate with each other.

With the advent of multiple processor bus/core speed ratios, it has been desirable to be able to query the processor for the maximum tested frequency in order to correctly set the bus ratio. If the ratio is set incorrectly, the processor could either be running faster than it is specified to operate or it may be operating at a non-optimal frequency. Unfortunately, the maximum core frequency is one of the last items to be tested in the manufacturing of integrated circuits and processors. In other words, it is characteristic that is not known until post-test (i.e., a post-test characteristic). Note that this assumes that all packages are built and wired substantially the same when the package is sealed. It would be desirable to be able to query the processor (or integrated circuit) for the maximum tested core frequency after the package has been sealed by changing package wiring to reflect test frequency.

One possible solution to allow a processor to be queried and indicated its maximum tested core frequency which would be stored in an EPROM cell on these processor devices itself. However, this is not desirable because it increases die size and impacts the yield.

Another possible solution is to test the microprocessor and then add the identifying wiring. This could be done by sealing packages post-test. However, this additional step adds capital equipment and test time, which increases the cost of the microprocessor, and leaves the delicate silicon chip exposed to damage and loss during testing.

In the fabrication of microprocessors, it is common to find that some of the microprocessors are able to operate at higher frequencies than others even though all are fabricated with the same process. Process variations effecting, for example, the thickness of oxides can cause some wafers runs to yield parts that operate at much higher frequencies than in other wafers runs. Some companies test the upper frequency performance of newly fabricated microprocessors and sort them into "frequency" bins. Consequently, some microprocessors when sold, are graded (and labeled) for higher frequencies than others. Generally, the higher the tested and guaranteed operating frequency, the higher the price of the micrprocessor. The microprocessor may not function properly at frequencies above its labeled frequency, especially under stressful ambient conditions or marginal power supply potentials.

The labeling of a microprocessor is done with a laser which cuts through the surface of the package to make a human-readable, permanent identification. This has proven more reliable than ink marking. Note that lasers have also been used to tune resistors in packages and to blow fuses on the silicon.

Companies have found that parts labeled with one frequency are sometimes relabeled after being sold by the manufacturer with higher frequencies, and then resold. These relabeled parts could end up in computer systems sold to operate at higher frequencies than the manufacturer intended. An innocent purchaser of such a computer could find that the computer operates well part of the time but fails at other times. The failures may be difficult to trace and if traced to the microprocessor, reflect badly on the manufacturer.

The present invention provides identification information corresponding to characteristics of integrated circuits, such as, for example, their core frequency, in their package. The identification is added to the package after testing (i.e., post-test). Furthermore, the identification information is permanent and, thus, prevents remarking. Since the indentification is done at the same time and using the same equipment as human readable marking, no additional cost is added to the integrated circuit.

SUMMARY OF THE INVENTION

An integrated circuit device is described. The integrated circuit device includes a package and an indicator. The package encapsulates an integrated circuit die which has an on-chip driver and an input buffer. The indicator indicates a characteristic of the integrated circuit die that is based on the electrical continuity of the indicator from the on-chip driver to the input buffer.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1 is a perspective view of integrated circuit package of the present invention.

FIG. 2 illustrates a side section view of the package of the present invention and a detection point.

FIG. 3 is a process of fabricating the integrated circuit of the present invention.

FIG. 4 is a perspective view of the integrated circuit package of the present invention illustrating two cut lines directed through metal traces in the package.

FIG. 5 illustrates a side section view of an alternate embodiment of the present invention.

FIG. 6 illustrates one embodiment of the present invention for use with packages having only one wiring plane.

DETAILED DESCRIPTION OF THE PRESENT INVENTION

An integrated circuit package is described. In the following description, numerous details are set forth, such as specific numbers of pins, numbers of traces, types of integrated circuit characteristics, etc., in order to provide a thorough understanding of the present invention. It will be apparent, however, to one skilled in the art, that the present invention may be practiced without these specific details. In other instances, well-known structures and devices are shown in block diagram form, rather than in detail, in order to avoid obscuring the present invention.

The present invention provides integrated circuit (IC) packages with permanent indications of device characteristics. In one embodiment, the permanent indications comprise metal traces on or near the surface of the package. Based on these traces, information corresponding to one or more characteristics of the integrated circuit(s) contained therein may be encoded into the package and used as a permanent reference for the information in the future. Using such an indication structure, various characteristics of the IC may be set forth, such as operating frequency, operating voltage, cache memory availability, cache memory size, etc. Note that many of these characteristics are post-test characteristics. Serial numbers may also be encoded in this manner. These permanent identification are directly readable by the microprocessor during run-time operation. As is discussed below, the present invention may provide packages with permanent indications of device characteristics by modifying them "digitally" though a closed-loop implementation in the chip.

FIG. 1 illustrates an integrated circuit package of the present invention. Referring to FIG. 1, the top of the package 101 shown with metal traces 102 near or on the surface and pins 103 at the bottom. Metal traces are standard elements of package construction and are well-known in the art. In one embodiment, metal traces 102 run parallel to a side of package 101.

The material comprising package 101 may be any one of the commonly used materials, such as, but not limited to, ceramic, plastic, etc. Metal traces 102 may comprise any conductive material (e.g., copper, gold, etc.). In one embodiment, metal traces 102 comprises 8 traces. However, any number of traces that can fit on the surface may be used (e.g., 1, 2, 3, 4, 16, 32, etc.). In one embodiment, each of the metal traces 102 is separated from neighboring traces by approximately the width of a single trace. Note that the distance between the metal traces is a design choice, as is the location of the metal traces on (or below) the surface of the package.

In one embodiment, metal traces 102 are below the external surface of package 101, as opposed to being on the surface. Metal traces 102 may be below the top layer of ceramic in a ceramic package.

FIG. 2 illustrates a section side view of package 101. Referring to FIG. 2, package 101 is shown having multiple package layers. Note that some of the package layers have been omitted to avoid obscuring the present invention. Ground planes, such as ground plane 202, are sandwiched between package layers, such as signal layers 203 and 204. An optional package layer 200 may be used to cover traces below the surface of the package 101.

One end of each of the metal traces attached in a manner well-known in the art at or near the surface of the package are coupled to the ground plane through the package. The other end of each of the traces is coupled through the package to a separate pin, such as pin 205, on the package that is used to detect the electrical state of the attached trace.

To detect the condition state of each trace, a weak current, such as 0-25 mA, is applied through a resistor 206 (e.g., 10KΩ) to the pin. If a metal trace is not cut, the electrical connection to ground is still intact and the short on the package causes the detected signal to be low. If metal trace is cut, the application of the current results in the detect signal being set high.

Different encodings of the metal traces is based on their conductivity and is accomplished by cutting one or more of the metal traces. The process of cutting is described in further detail below. Two separate cut lines, 207 and 208, are shown.

One embodiment of the process of the present invention for adding the permanent identification to the package is shown in the flowchart of FIG. 3. Referring to FIG. 3, the process begins by identifying the characteristic to be encoded, post-test or otherwise (processing block 301). Then, a determination is made as to which of the metal traces are to be cut (processing block 302).

Once determined, the designated metal traces are cut (processing block 303). In one embodiment, the designated metal traces are cut during a laser etch. The laser marking machine which is used to write the permanent human-readable package marking may also used to cut the metal traces. In alternate embodiments, a mechanical drill or cutter may be used. One or more cuts are made to each of the traces being cut. By including two cuts, no voltage gradient exists across the cut and the trace will not reconnect itself during use due to electromigration. FIG. 4 illustrates the two cut lines.

Optionally, any microscopic holes created during the cutting process may be filled, or plugged (processing block 304). In one embodiment, the material used to fill the hole comprises epoxy. Filling the holes prevents electromigration as well as prevents unscrupulous individuals from easily reconnecting traces.

Because these permanent identifications are readable by a computer, using the present invention, the BIOS of a computer system is able to configure a flexible motherboard at boot time to accept any of the CPU/cache arrangements which plug into the same socket. The characteristics of the plugged-in component would be read and that information would be used to configure the system.

In an alternate embodiment, each metal trace is coupled to the integrated circuit inside the package. In one embodiment, each metal trace is coupled to a register in the IC device, as opposed to a pin. The register may then be read using software to obtain the necessary characteristic information.

In one such embodiment, an output driver on the IC chip in the package is coupled to or routed to the one or more conductive (e.g., metal) interconnect traces in the package. The other ends of the traces are coupled to one or more input buffers on the IC chip. Therefore, the traces are routed very near the surface of the package and do not connect to any external pins. Although the traces are under the surface, they are routed in a manner that allows each of the traces to be cut or divided after test, as described above. Such an embodiment is shown in FIG. 5.

Referring to FIG. 5, a side section package view of the integrated circuit of the present invention is shown with an on-chip driver (buffer) 501 coupled to a signal plane 502. Signal plane 502 is coupled to one end of a trace 503 (shown with a laser cutting two traces). Another end of trace 503 is coupled to signal plane 505. Signal plane 505 is separate from signal plane 502 by power plane 504. An on-chip input buffer 506 is coupled to signal plane 505 to receive input signals. Note that these elements may be directly connected together.

During a read configuration cycle, such as is executed by the Basic Input/Output System (BIOS), the integrated circuit powers on output driver 506 and latches each of the input buffers 506, one coupled to each trace, into a register on the chip (not shown). If the trace hasn't been cut, each input buffer 506 reads the state of the output buffer. If the trace has been cut, thereby representing an open circuit, the input buffer is pulled to the opposite of the output buffer.

By executing a configuration read cycle, the BIOS may dynamically configure a motherboard at boot time to accept any type of CPU/cache memory integrated circuit types that are capable of plugging into the same socket. This is advantageous over the prior art in which the motherboard is manually configured to enable receipt of different IC types.

Using the present invention, a software program can be run by the integrated circuit to detect when the CPU is being operated beyond the tested and guaranteed performance range.

In one embodiment, when the configuration characteristic is not being read, the output buffer 506 is disabled to reduce the standby current on the device caused by strapping a trace to either a power plane or a ground plane. Note that disabling an output driver is well-known to those skilled in the art.

FIG. 6 illustrates one embodiment of the present invention for use with packages having only one wiring plane (e.g., a single lead frame), such as many tape carrier packages or molded plastic packages. Referring to FIG. 6, the bond pad of an output driver 601 is adjacent to bond pads of input buffers 606. Note that, as discussed above, two separate cut lines may be used.

Whereas many alterations and modifications of the present invention will no doubt become apparent to a person of ordinary skill in the art after having read the foregoing description, it is to be understood that the particular embodiment shown and described by way of illustration is in no way intended to be considered limiting. For instance, to expand the number of bits that may be used to identify a characteristic, diodes (or their digital equivalents) may be manufactured in the package itself during the package manufacturing process. This would allow for entire arrays of cut lines, which could be programmed. Such an arrangement would allow for denser use of bond pads and allow for increased numbers of bits to be made available. Therefore, references to details of various embodiments are not intended to limit the scope of the claims which in themselves recite only those features regarded as essential to the invention.

Thus, a method and apparatus for providing characteristic identification has been described.

We claim:

1. An integrated circuit device comprising:
    a package encapsulating an integrated circuit die having an on-chip driver and an input buffer; and
    at least one conductive indicator coupled through a portion of the package to the on-chip driver and the input buffer to encode a characteristic of said integrated circuit die based on electrical continuity of said at least one indicator from the on-chip driver to the input buffer.

2. The device defined in claim 1 further comprising a register coupled to the input buffer, wherein the register latches and stores the state of the output buffer when reading the characteristic.

3. The device defined in claim 1 wherein said integrated circuit die reads the characteristic during a configuration cycle.

4. The device defined in claim 1 wherein the characteristic comprises a post-test characteristic.

5. The device defined in claim 4 wherein the post-test characteristic comprises an operating frequency of the integrated circuit die.

6. The device defined in claim 4 wherein the post-test characteristic comprises an operating voltage of said integrated circuit die.

7. The device defined in claim 4 wherein the post-test characteristic comprises an indication as to additional memory within the package.

8. The device defined in claim 7 wherein the post-test characteristic indicates cache memory availability.

9. The device defined in claim 8 wherein the post-test characteristic indicates cache memory size.

10. The device defined in claim 1 wherein said output driver is disabled after reading the state of the output driver.

11. The device defined in claim 1 wherein said at least one conductive indicator is disposed within the package below an exterior surface of the package.

12. The device defined in claim 1 wherein said at least one conductive indicator comprises one or more metal traces.

13. A method of determining a characteristic of an integrated circuit device having a package, said method comprising the steps of:
    encoding the characteristic permanently into the package by cutting metal traces disposed beneath the surface of the package;
    the device reading the characteristic through input buffers coupled to the metal traces by driving output buffers coupled to the metal traces.

14. The method defined in claim 13 wherein the step of cutting the metal traces comprises laser marking the package by cutting the metal traces.

15. The method defined in claim 13 further comprises the step of reading the characteristic to determine the operating speed.

16. The method defined in claim 15 configuring the computer system based on the characteristic.

17. An integrated circuit device comprising a package comprising:
    a package encapsulating an integrated circuit die having an on-chip driver and an input buffer and first and second signal planes;
    at least one conductive indicator, coupled through a portion of the package to the on-chip driver via the first signal plane and the input buffer via the second signal plane, to encode a characteristic of the integrated circuit die based on electrical continuity of said at least one conductive indicator from the on-chip driver to the input buffer.

18. The device defined in claim 17 further comprising a register coupled to the input buffer, wherein the register latches and stores the state of the output buffer when reading the characteristic.

19. The device defined in claim 17 wherein the characteristic comprises a post-test characteristic.

20. The device defined in claim 17 wherein said at least one conductive indicator comprises one or more metal traces.

* * * * *